(12) United States Patent
Xu (10) Patent No.: US 9,406,851 B2
(45) Date of Patent: Aug. 2, 2016

(54) SURFACE-TEXTURED ENCAPSULATIONS FOR USE WITH LIGHT EMITTING DIODES

(71) Applicant: BRIDGELUX, INC., Livermore, CA (US)

(72) Inventor: Tao Xu, Livermore, CA (US)

(73) Assignee: Bridgelux Incorporated, Livermore, CA (US)

( * ) Notice: Subject to any disclaimer, the term of this patent is extended or adjusted under 35 U.S.C. 154(b) by 0 days.

(21) Appl. No.: 14/309,678

(22) Filed: Jun. 19, 2014

(65) Prior Publication Data

US 2014/0299896 A1  Oct. 9, 2014
US 2016/0155910 A9  Jun. 2, 2016

Related U.S. Application Data

(63) Continuation of application No. 12/978,204, filed on Dec. 23, 2010, now Pat. No. 8,783,915, which is a continuation-in-part of application No. 12/704,326, filed on Feb. 11, 2010, now Pat. No. 8,076,683.

(51) Int. Cl.

| F21V 5/00 | (2006.01) |
|---|---|
| H01L 33/54 | (2010.01) |
| H01L 33/48 | (2010.01) |
| H01L 27/15 | (2006.01) |
| H01L 33/58 | (2010.01) |
| H01L 25/075 | (2006.01) |

(52) U.S. Cl.
CPC ............. *H01L 33/54* (2013.01); *H01L 27/156* (2013.01); *H01L 33/48* (2013.01); *H01L 33/58* (2013.01); *H01L 25/0753* (2013.01); *H01L 2924/0002* (2013.01); *H01L 2924/1815* (2013.01); *H01L 2933/0091* (2013.01)

(58) Field of Classification Search
CPC . H01L 33/54; H01L 33/48; H01L 2933/0091; F21V 5/005
USPC .......................................... 362/330, 332, 339
See application file for complete search history.

(56) References Cited

U.S. PATENT DOCUMENTS

| 5,993,075 A | 11/1999 | Huang et al. |
| 6,133,589 A | 10/2000 | Krames et al. |
| 6,410,942 B1 | 6/2002 | Thibeault et al. |
| 6,495,862 B1 | 12/2002 | Okazaki |

(Continued)

FOREIGN PATENT DOCUMENTS

| CN | 1797808 A | 7/2006 |
| CN | 201060876 Y | 5/2008 |

(Continued)

OTHER PUBLICATIONS

U.S. Appl. No. 12/039,563, filed Feb. 28, 2008, Ray-Hua Hong.

(Continued)

*Primary Examiner* — Nimeshkumar Patel
*Assistant Examiner* — Christopher Raabe
(74) *Attorney, Agent, or Firm* — Arent Fox LLP (57) ABSTRACT

Surface-textured encapsulations for use with light emitting diodes. In an aspect, a light emitting diode (LED) array apparatus includes a plurality of LEDs mounted to a substrate and an encapsulation covering the LEDs and having a surface texturing configured to extract light, wherein the surface texturing is includes at least one light extracting feature having a diameter larger than two or more of the LEDs.

20 Claims, 6 Drawing Sheets

(56) References Cited

U.S. PATENT DOCUMENTS

| | | | |
|---|---|---|---|
| 6,498,355 | B1 | 12/2002 | Harrah et al. |
| 6,568,820 | B1 | 5/2003 | Ohkawa et al. |
| 6,649,440 | B1 | 11/2003 | Krames et al. |
| 6,657,236 | B1 | 12/2003 | Thibeault |
| 7,187,501 | B2 | 3/2007 | Wakisaka |
| 7,193,720 | B2 | 3/2007 | Gatt |
| 7,268,371 | B2 | 9/2007 | Krames et al. |
| 8,580,372 | B2 | 11/2013 | Wu et al. |
| 8,783,915 | B2 * | 7/2014 | Xu .................................. 362/330 |
| 2003/0151361 | A1 | 8/2003 | Ishizaka |
| 2004/0206969 | A1 | 10/2004 | Orita |
| 2005/0133808 | A1 | 6/2005 | Uraya et al. |
| 2005/0265404 | A1 | 12/2005 | Ashdown |
| 2006/0054904 | A1 | 3/2006 | Lin et al. |
| 2006/0105484 | A1 | 5/2006 | Basin et al. |
| 2006/0189013 | A1 | 8/2006 | Schardt |
| 2007/0145397 | A1 | 6/2007 | DenBaars et al. |
| 2007/0148442 | A1 | 6/2007 | Shibayama et al. |
| 2007/0257271 | A1 | 11/2007 | Ouderkirk et al. |
| 2007/0284993 | A1 | 12/2007 | Kim et al. |
| 2008/0035936 | A1 | 2/2008 | Lester |
| 2008/0074032 | A1 | 3/2008 | Yano et al. |
| 2008/0111146 | A1 | 5/2008 | Nakamura et al. |
| 2008/0121918 | A1 | 5/2008 | DenBaars et al. |
| 2008/0128730 | A1 | 6/2008 | Fellows et al. |
| 2008/0142822 | A1 | 6/2008 | Kim |
| 2008/0157110 | A1 | 7/2008 | Huang et al. |
| 2009/0050907 | A1 | 2/2009 | Yuan et al. |
| 2009/0127575 | A1 | 5/2009 | Horng et al. |
| 2009/0153023 | A1 | 6/2009 | Shylo et al. |
| 2009/0321759 | A1 | 12/2009 | Xu |
| 2010/0033829 | A1 | 2/2010 | Wippermann et al. |
| 2010/0213847 | A1 | 8/2010 | Biondo et al. |

FOREIGN PATENT DOCUMENTS

| | | |
|---|---|---|
| HK | 11108674.3 | 8/2011 |
| JP | 1987065855 | 3/1987 |
| JP | 2003234509 | 8/2003 |
| JP | 2006024615 | 1/2006 |
| JP | 2007005091 | 1/2007 |
| JP | 2007042320 | 2/2007 |
| JP | 2007042320 A | 2/2007 |
| JP | 2007227919 | 9/2007 |
| JP | 2007227919 A | 9/2007 |
| JP | 2006148147 | 6/2008 |
| TW | 20101763 A | 1/2010 |
| WO | JP2007005749 | 1/2007 |
| WO | WO 2009158313 A1 | 12/2009 |

OTHER PUBLICATIONS

U.S. Appl. No. 12/163,594, filed Jun. 27, 2008, Tao Xu.
U.S. Appl. No. 12/702,326, filed Feb. 9, 2010, Kuo et al.
U.S. Appl. No. 12/704,326, Feb. 11, 2010, Tao Xu.
PCT Search Report with Written Opinion, PCT/US2009/048184, dated Aug. 17, 2009.
Japanese Office Action dated Nov. 19, 2013 re JP2011516501, and English Translation.
IPRP dated Dec. 1, 2011 regarding PCT/US2009/048184.
Decision on Final Rejection dated Apr. 15, 2014, regarding Japanese Patent Application No. 2011-516501.
Reexamination Report dated Sep. 19, 2014 regarding Japan Application No. JP2011-516501.
Korean Final Rejection dated Oct. 26, 2015, regarding Korean Application No. KR2010-7029549.
First China Office Action dated Mar. 23, 2012 regarding China Application No. 200980133115.5.
Second China Office Action dated Dec. 10, 2012 regarding China Application No. 200980133115.5.
Supplementary European Search Report and Search Opinion dated Mar. 6, 2015, regarding EP Application No. EP09770847.
Korean Office Action dated Mar. 20, 2015, regarding Korean Application No. KR2010-7029549.
Appeal Decision dated Jun. 9, 2015, regarding Japanese Application No. JP2011-516501.
Extended European Search Report, Supplementary European Search Report, Annex to ESR and Search Opinion dated Mar. 6, 2015 (received in our office Jun. 19, 2015) regarding EP09770847.3.
Notice of Decision for Final Rejection dated Mar. 9, 2016, regarding Korean Application No. KR10-2016-7003686.

* cited by examiner

FIG. 1

(Prior Art)

SURFACE-TEXTURED ENCAPSULATIONS FOR USE WITH LIGHT EMITTING DIODES

CROSS-REFERENCE TO RELATED APPLICATIONS

This is a continuation of U.S. patent application Ser. No. 12/978,204, filed Dec. 23, 2010, entitled "SURFACE-TEXTURED ENCAPSULATIONS FOR USE WITH LIGHT EMITTING DIODES," which was a continuation-in-part application of U.S. patent application Ser. No. 12/704,326, filed Feb. 11, 2010, now U.S. Pat. No. 8,076,683, filed Dec. 13, 2011 entitled "SURFACE-TEXTURED ENCAPSULATIONS FOR USE WITH LIGHT EMITTING DIODES," and which was also a continuation-in-part of U.S. patent application Ser. No. 12/898,942, filed Oct. 6, 2010, now U.S. Pat. No. 8,169,141, filed May 1, 2012 entitled "METHOD AND APPARATUS FOR GENERATING PHOSPHOR FILM WITH TEXTURED SURFACE," the contents of each of which are hereby incorporated by reference herein in their entireties.

PRIORITY

This patent application is a continuation-in-part (CIP) of co-pending U.S. patent application Ser. No. 12/704,326, filed on Feb. 11, 2010, and entitled "SURFACE-TEXTURED ENCAPSULATIONS FOR USE WITH LIGHT EMITTING DIODES".

This patent application is a continuation-in-part (CIP) of co-pending U.S. patent application Ser. No. 12/898,942, filed on Oct. 6, 2010, and entitled "METHOD AND APPARATUS FOR GENERATING PHOSPHOR FILM WITH TEXTURED SURFACE".

BACKGROUND

1. Field

The present application relates generally to light emitting diodes, and more particularly, to surface-textured encapsulations for use with light emitting diodes to provide for enhanced light output.

2. Background

Light emitting diodes (LEDs) for use as indicators are well known. LEDs have been used extensively for this purpose in consumer electronics. For example, red LEDs are commonly used to indicate that power has been applied to devices such as radios, televisions, video recorder (VCRs) and the like.

Recently, high-power LEDs have seen increased use in general lighting applications. For example, power LEDs can now be found in overhead lighting, table lamps, and in automotive application, such as in automobile headlamps. Typically, high-power LEDs are provided as part of an assembly comprising a LED mounted to a substrate and protected by encapsulation. Light emitted from the LED passes through the encapsulation before it is visible to a user. However, there is light loss in the encapsulation layer in the LEDs. This is due in part to internal reflections occurring at the interface between the encapsulation and the air.

Various techniques have been tried to improve the light output of the LEDs. For example, the addition of a lens to the encapsulation layer has been used to extract additional light. However, the additional lens material impacts the thermal properties of the LED assembly by reducing heat dissipation. Also, the addition of the lens increases the cost of processing and manufacture of the LED assembly.

Therefore, what is needed is a way to increase the optical output of high power LEDs while providing excellent heat dissipation and reduced processing and manufacturing costs.

SUMMARY

In one or more aspects, a surface-textured encapsulation layer is provided for use with one or more light emitting diodes so as to provide increased optical output, excellent heat dissipation, and reduced processing costs.

Aspects of the embodiments will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DESCRIPTION

In various aspects, a surface-textured encapsulation is provided for use with one or more light emitting diodes so as to provide increased optical output, improved heat dissipation, and reduced processing costs.

The present invention is described more fully hereinafter with reference to the accompanying Drawings, in which various aspects of the present invention are shown. This invention may, however, be embodied in many different forms and should not be construed as limited to the various aspects presented throughout this disclosure. Rather, these aspects are provided so that this disclosure will be complete enough to provide a thorough understanding of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes may not illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the Drawings. By way of example, if an apparatus in the Drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 1:
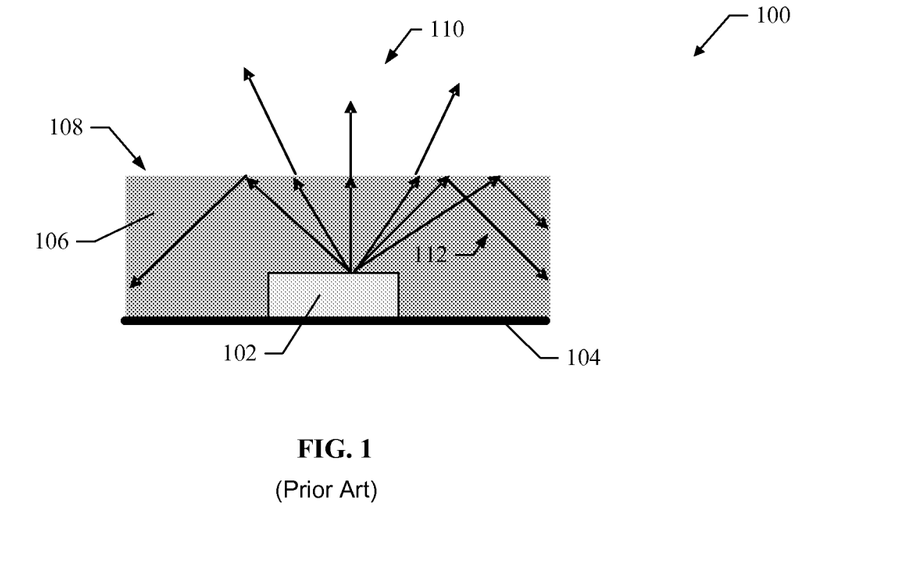
FIG. 1 shows a LED assembly with a conventional encapsulation.

FIG. 1 shows a LED assembly 100 with a conventional encapsulation. The LED assembly 100 comprises a LED 102 mounted to a substrate 104. The substrate provides electrical power to the LED which converts the electrical power to light and the light is emitted from the surface of the LED 102. The LED 102 is encapsulated with an encapsulation 106 that has a flat smooth surface as illustrated at 108. During operation, light emitted from the LED 102 travels through the encapsulation 106 and is emitted from the LED assembly 100 as illustrated at 110. However, because of the smooth flat surface 108 of the encapsulation 106, some light emitted from the LED 102 is incident upon the surface 108 at an angle that is less than a critical angle. The critical angle is an angle formed between a boundary and incident light and is determined by the refractive index property of the materials at the interface. Light striking the boundary at less than the critical angle will be reflected back into the encapsulation instead of passing through the boundary. As illustrated at 112, light reflected within the encapsulation 106 is not emitted from the LED assembly 100. Thus, the LED assembly 100 operates inefficiently and therefore provides reduced light output. Conventional LED assembles may include additional lens material added to the encapsulation to remove the total internal reflection and to extract more light. However, the added lens material reduces the heat dissipation properties of the LED assembly 100 and adds additional processing and manufacturing costs.

Figure 2:
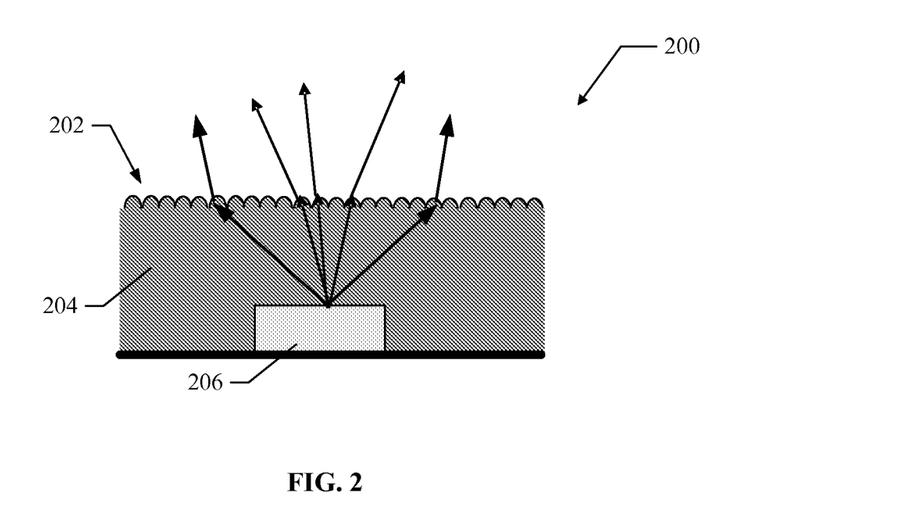
FIG. 2 shows a LED assembly with a surface-textured encapsulation configured for light extraction.

FIG. 2 shows aspects of a LED assembly 200 with a surface-textured encapsulation configured for light extraction. For example, the LED assembly 200 includes an encapsulation 204 that comprises a textured surface 206. In an aspect, the textured surface 206 comprises a field of light extracting geometric features or shapes (in this case hemisphere shapes) that are stamped, molded, pattern transferred, or otherwise applied to the encapsulation 204. However, as described below in various aspects, the textured surface 206 may comprise surface-texturing formed by a variety of light extracting geometric shapes.

The textured surface 206 is configured so that light emitted from the LED 202 will incident upon a large portion of the encapsulation surface at angles that are greater than the critical angle. This means that less light will be reflected and more light will be extracted from the LED assembly 200 than from the LED assembly 100. And, since the use of additional lens material is not needed, the LED assembly 200 provides increased light output and excellent heat dissipation properties while avoiding additional processing and manufacturing costs.

In various aspects, the surface-textured encapsulation 204 is suitable for use with virtually any color LED. For example, the surface-textured encapsulation 204 will extract additional light emitted from red, blue, green, amber or white LEDs. It should also be noted that the surface-textured encapsulation can be used with other types of light sources and is not limited to be used only with LED light sources. Furthermore, the surface-textured encapsulation 204 may be composed of any suitable material, such as silicone or phosphor.

Figure 3:
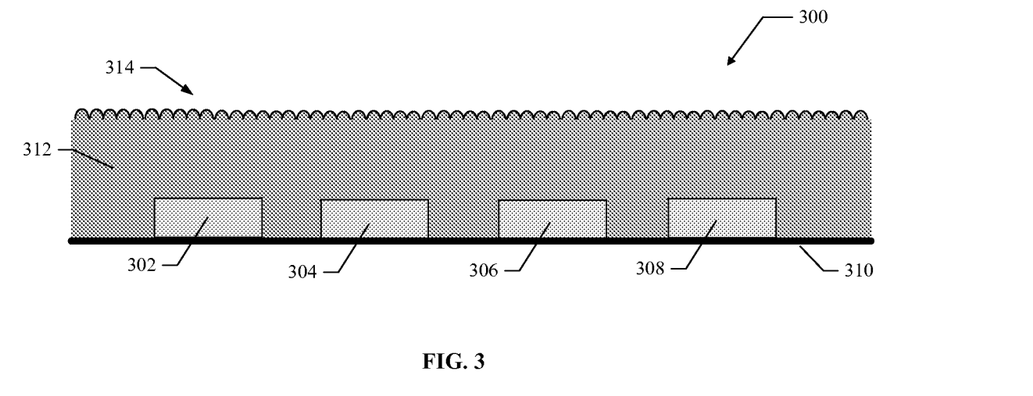
FIG. 3 shows aspects of a multi-LED assembly with surface-textured encapsulation.

FIG. 3 shows aspects of a multi-LED assembly 300 with surface-textured encapsulation. The assembly 300 comprises LEDs 302-308 mounted to a substrate 310. The assembly 300 also comprises encapsulation 312 have a textured surface 314. The textured surface 314 is configured to extract light emitted by the LEDs 320-308. Thus, FIG. 3 illustrates that aspects of an encapsulation with surface-texturing is scalable for use with any number of LEDs and these LEDs can be any combination of LEDs of different colors to increase light output while providing excellent heat dissipation and avoiding the processing costs of additional lens material.

Figure 4:
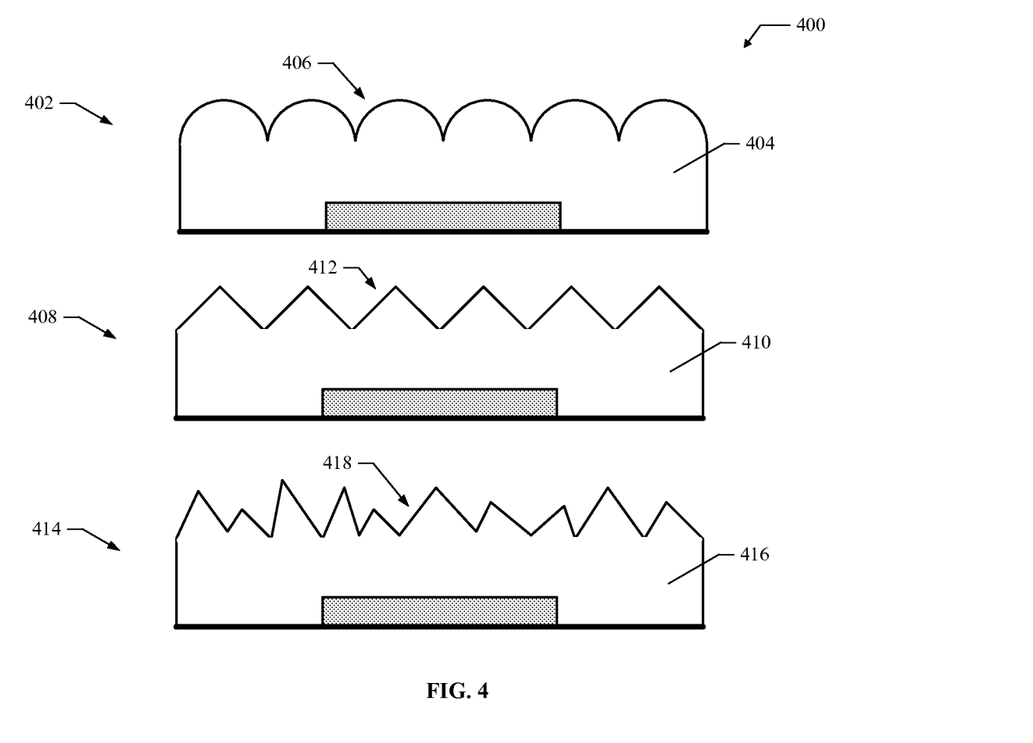
FIG. 4 shows aspects of three LED assemblies having encapsulations comprising different surface texturing.

FIG. 4 shows aspects of three LED assemblies 400 having encapsulations comprising different surface texturing. FIG. 4 illustrates that surface texturing comprising a variety of light extracting geometric features or shapes may be use to improve light extraction from LED assemblies.

A first LED assembly 402 is shown having an encapsulation 404 with surface texturing 406 comprising light extracting geometric shapes forming hemispheres. The dimensions of the hemispheres (i.e., radius, diameter) are selected to provide an increase amount of extracted light as opposed to an un-textured encapsulation. For example, if a square LED is used that has a side dimension of two millimeters (mm); the diameter of the hemispheres may be in the range of one micrometer to one millimeter. Thus, the diameter of the hemispheres is less than the dimension of the LED or other suitable light source.

It should also be noted that in various aspects, the light extracting geometric features or shapes may have varying dimensions. For example, the hemispheres shown at 406 may have varying dimensions and are not limited to having the same dimensions.

A second LED assembly 408 is shown having an encapsulation 410 with surface texturing 412 comprising light extracting geometric shapes forming cones or pyramids. The dimensions of the cones or pyramids (i.e., base area and height) are selected to provide a desired amount of extracted light.

A third LED assembly 414 is shown having an encapsulation 416 with surface texturing 418 comprising light extracting random geometric shapes. The random geometric shapes may have any dimensions to provide a desired amount of extracted light. For example, random pyramid shapes having a range of base areas and heights may be selected to provide a desired amount of light extraction.

Thus, the LED assemblies 400 illustrate that surface texturing comprising a variety of light extracting features or geometric shapes may be use to improve light extraction in accordance with the various aspects.

Figure 5:
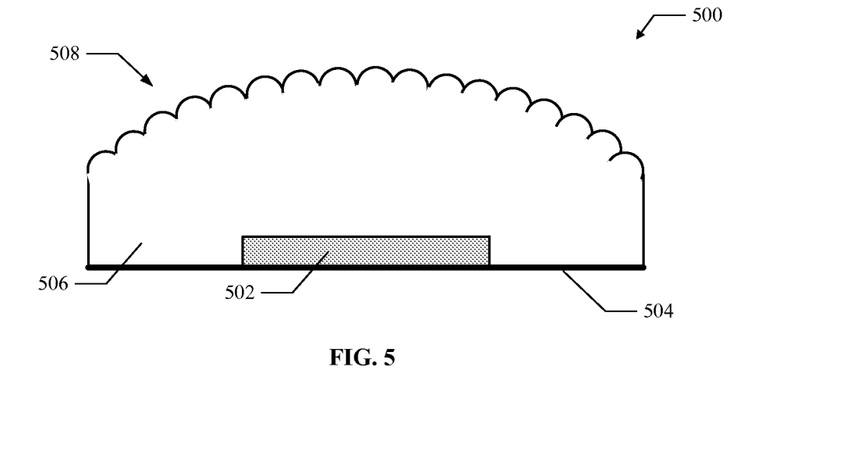
FIG. 5 shows a LED assembly that comprises aspects of surface textured encapsulation wherein the overall shape of the encapsulation is selected to provide for additional light extraction.

FIG. 5 shows a LED assembly 500 that comprises aspects of surface textured encapsulation wherein the overall shape of the encapsulation is selected to provide for additional light extraction. For example, the LED assembly 500 comprises a LED 502, substrate 504, and encapsulation 506. The encapsulation 506 comprises surface texturing 508 in accordance with the various aspects presented herein. The encapsulation 506 also has an overall shape to provide additional light extraction. For example, the encapsulation 506 has an overall dome shape (i.e., higher at the center than at the edges) that is configured to provide additional light extraction. It should be noted that aspects of the surfaced textured encapsulation are not limited to encapsulations with a dome shape as illustrated in FIG. 3 and that any desired overall encapsulation shape may be utilized to provide for increased light extraction.

Thus, aspects of surface textured encapsulations described herein may comprise any desired overall shape to improve light extraction.

Figure 6:
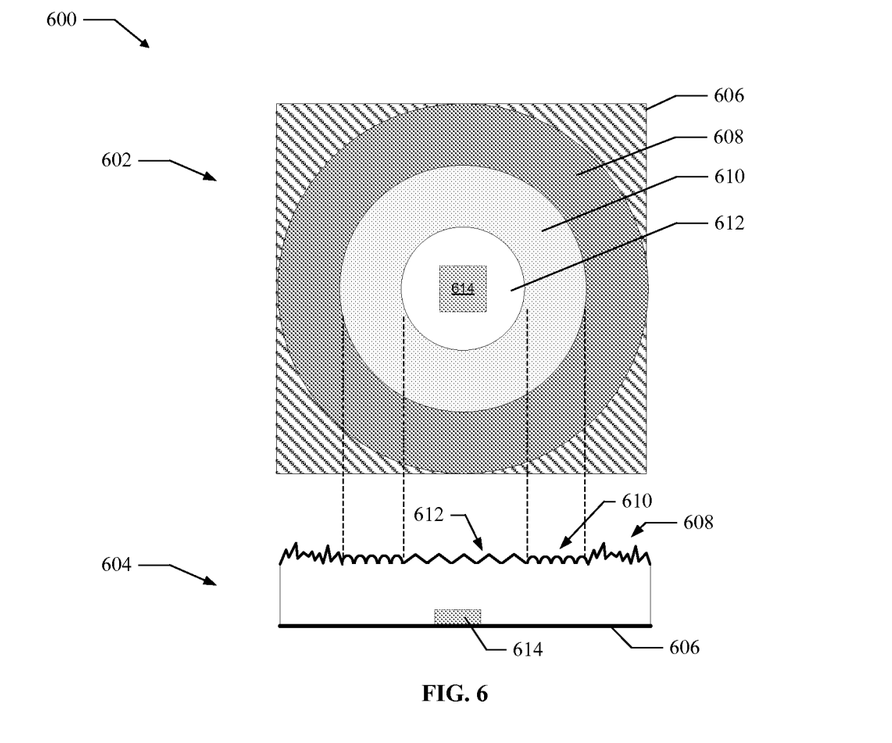
FIG. 6 shows a LED assembly comprising aspects of an encapsulation having multiple surface-textured regions.

FIG. 6 shows a LED assembly 600 comprising aspects of an encapsulation having multiple surface-textured regions. For example, to illustrate the multiple surface-textured regions, the LED assembly 600 is shown in a side view perspective 604 and a corresponding top view perspective 602. The LED assembly 600 comprises LED 614, substrate 606 and a multiple surface-textured encapsulation regions.

The multiple surface-textured encapsulation regions comprise a first region 608 having a random surface texturing. A second region 610 is provided that has a hemisphere shaped surface texturing, and a third region 612 is provided that has a cone shaped surface texturing.

Thus, in various aspects, a surface-textured encapsulation may comprise multiple regions where each region provides surface-texturing using different light extracting geometric shapes. As a result, an increased amount of light is extracted from a LED assembly over that of LED assemblies having smooth and/or flat encapsulations.

Figure 7:
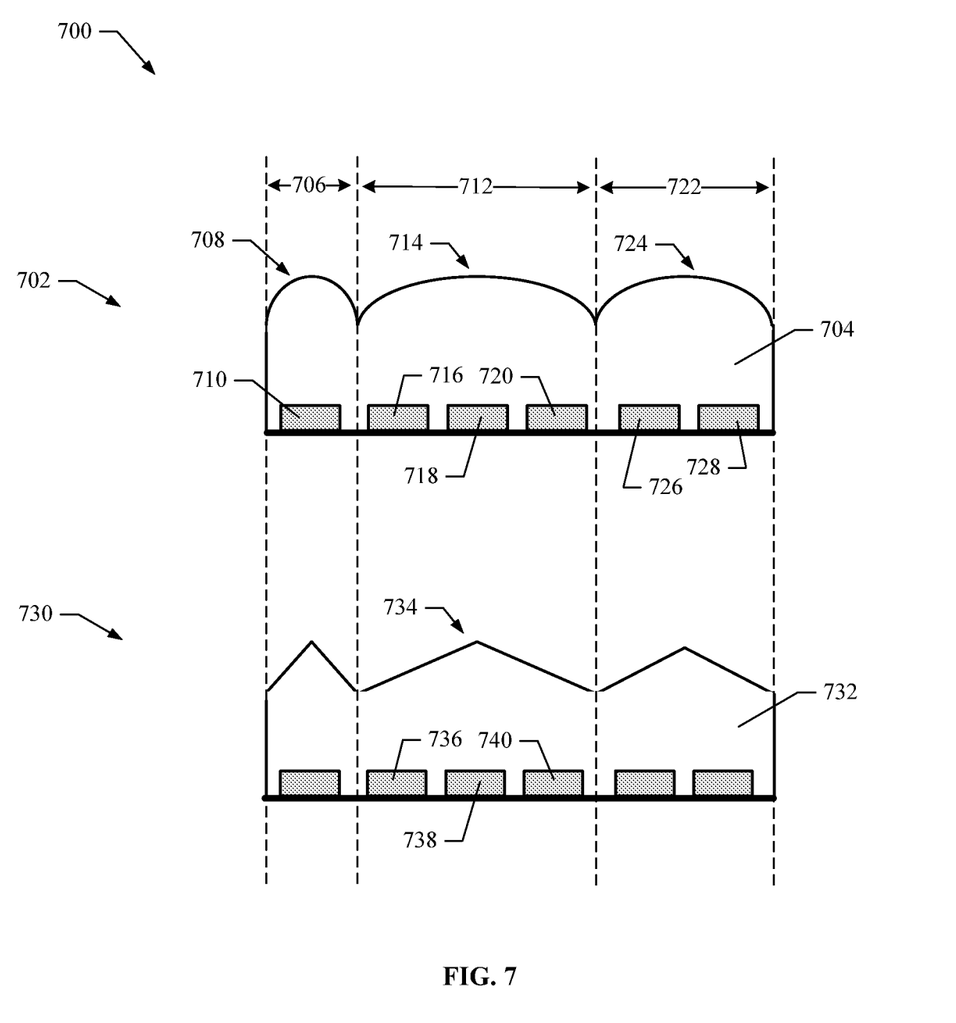
FIG. 7 shows LED assemblies comprising aspects of a surface textured encapsulation with light extracting features having diameters that span multiple LED devices.

FIG. 7 shows LED assemblies 700 comprising aspects of a surface textured encapsulation with light extracting features having diameters that span multiple LED devices. The LED assemblies 700 also illustrate that the diameters of the surface textured features or shapes may be the same or different and that each diameter can be greater than the dimensions of two more LED chips used in an LED assembly.

A first LED assembly 702 is shown having an encapsulation 704 with surface texturing comprising light extracting geometric shapes forming hemispheres. The dimensions of the hemispheres (i.e., radius or diameters) are selected to provide an increase amount of extracted light as opposed to an un-textured encapsulation. The hemispheres are also designed to have diameters larger than one or more LED chips. For example, the diameter 706 of hemisphere 708 is larger than the dimension of LED chip 710. Similarly, the diameter 712 of hemisphere 714 is larger than the dimension of LED chips 716, 718 and 720. Also, the diameter 722 of hemisphere 724 is larger than the dimension of LED chips 724 and 728.

In various aspects, the diameter of each hemisphere can be any selected value that is greater than the dimension of two or more LED chips.

A second LED assembly 730 is shown having an encapsulation 732 with surface texturing comprising light extracting geometric shapes forming cones (or pyramids). The dimensions of the cones (i.e., radius or diameters) are selected to provide an increase amount of extracted light as opposed to an un-textured encapsulation. The cones are also designed to have diameters larger than one or more LED chips. For example, the diameter of cone 734 is larger than the dimension of LED chips 736, 738 and 740. In various aspects, the diameter of each cone can be any selected value that is greater than 1 millimeter. In one implementation, the diameter of the surface texturing feature is less than 50 mm. Thus, the diameter of each cone can be greater than the dimension of two or more LED chips.

It should also be noted that in various aspects, the light extracting geometric features or shapes may have varying dimensions. For example, the hemispheres shown in assembly 702 may have varying dimensions and are not limited to having the same dimensions. For example, the diameter 712 may be 8 mm and the diameter 722 may be 6 mm.

Thus, the LED assemblies 700 illustrate that surface texturing comprising a variety of light extracting features or geometric shapes with varying diameters greater than the dimension of two or more LED chips may be use to improve light extraction in accordance with the various aspects.

Formation of Surface-Texturing

In various aspects, encapsulations having surface-texturing can be formed using a variety of techniques. For example, referring again to FIG. 6, the surface-textured light extracting features provided at 608, 610, and 612 can be formed from, created by, and/or applied to the encapsulation using one or more of the following techniques.

1. Molding—The encapsulation is molded to include the desired surface-textured features.
2. Stamping—The encapsulation is stamped to include the desired surface-textured features. For example, a partially-cured silicone encapsulation is stamped with a specially created stamp to form the desired features on the silicone surface. The silicone is allowed to fully cure thereby retaining the desired surface-texturing.
3. Pattern Transfer—A pattern layer is placed on top of the silicone or phosphor layer encapsulation. The pattern layer is stamped or molded and then etched so that the stamped or molded pattern is transferred (or applied) to the silicone or phosphor layer encapsulation.
4. Thin Film Deposition—depositing a thin film of material onto a base encapsulation or onto previously deposited layers to form the surface texture.

Figure 8:
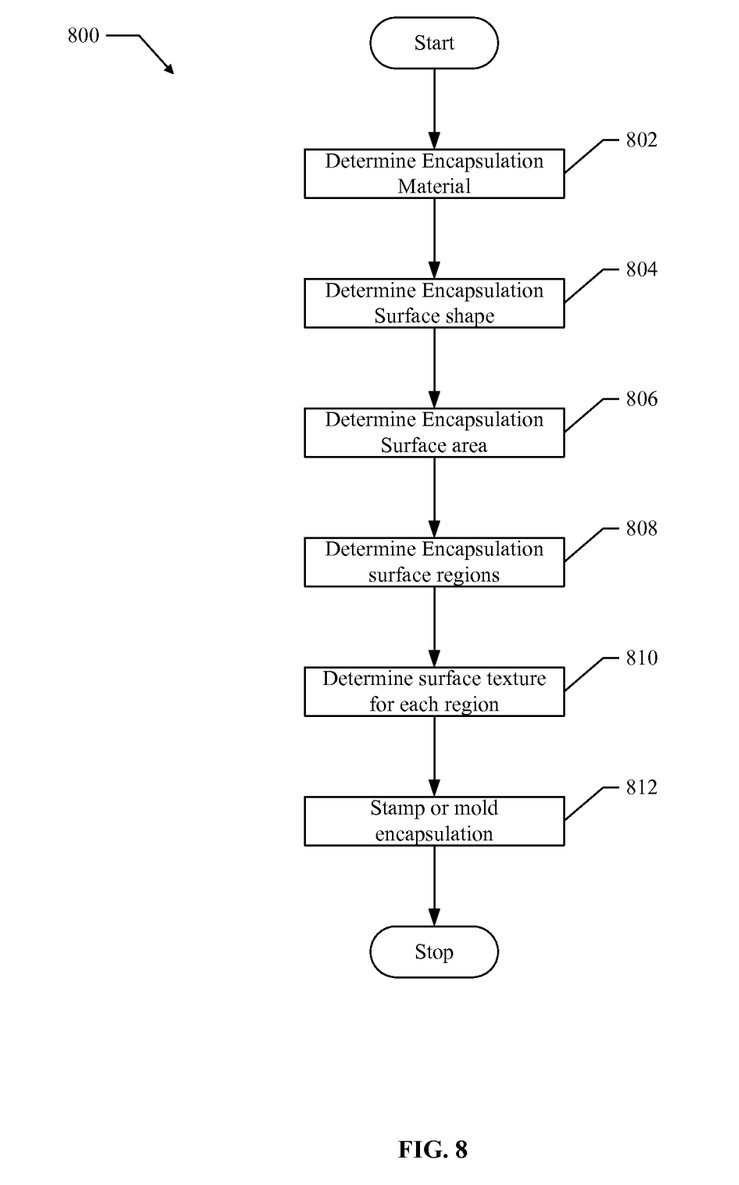
FIG. 8 shows an exemplary method for generation surface-textured encapsulations for extracting light from LEDs.

FIG. 8 shows an exemplary method 800 for generating surface-textured encapsulations for extracting light from LEDs. For clarity, the method 800 is described below with reference to the surface-textured encapsulations shown in FIGS. 5-7.

At block 802, an encapsulation material is determined. For example, the encapsulation material may be selected to be silicone or a phosphor layer.

At block 804, an encapsulation overall surface shape is determined. For example, the overall encapsulation surface shape may be approximately flat, domed as illustrated in FIG. 5, or any other desired surface shape.

At block 806, an encapsulation surface area is determined. For example, once the encapsulation surface shape is determined, the overall surface area is determined.

At block 808, encapsulation surface regions are determined. In an aspect, the surface regions divide the surface area determined at block 806. The encapsulation may be configured to comprise any number of surface regions. For example, the surface regions may be smaller or larger than the dimensions of one or more LED chips.

At block 810, surface texturing for each surface region is determined. For example, each surface region may be surface-textured with a different light extracting geometric shapes or features. Thus, as illustrated in FIG. 6, each region may be surface-textured to provide a desired amount of light extraction. Furthermore, as illustrated in FIG. 7, the light extracting features may have diameters greater than two or more LED chips.

At block 812, the encapsulation undergoes a stamping, molding, pattern transferring or thin film deposition process to have the surface shape, surface regions, and surface texturing in each region as configured in the operations above. It should also be noted that although several techniques have been disclosed herein for forming encapsulations with surface-texturing, virtually any technique or process may be used to generated encapsulations having surface-texturing as described herein.

Therefore, the method 800 operates to generate surface-textured encapsulations so that an increased amount of light can be extracted from a LED assembly as opposed to an un-textured encapsulation. It should be noted that the method 800 is just one implementation and that the operations of the method 800 may be rearranged or otherwise modified within the scope of the various aspects. Thus, other implementations are possible with the scope of the various aspects described herein.

Figure 9:
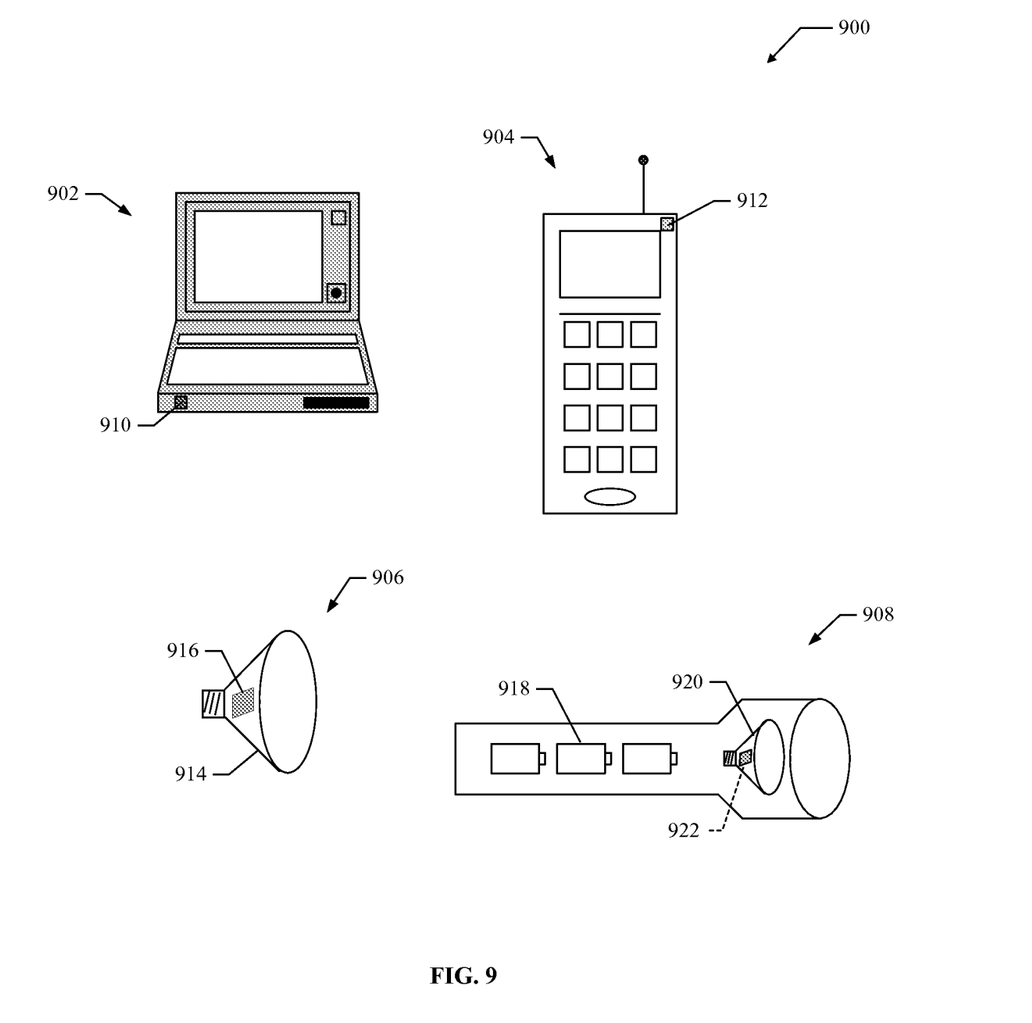
FIG. 9 shows exemplary devices having LED's with surface textured encapsulations as described herein.

FIG. 9 shows exemplary devices 900 suitable for use with LED's having surface textured encapsulations as described herein. For example, FIG. 9 shows a computer 902, portable telephone 904, a lamp 906 and an illumination device 908.

Each of the devices shown in FIG. 9 comprises an LED assembly having a surface-textured encapsulation configured for light extraction as described herein. For example, the computer 902 comprises LED assembly 910 and the portable telephone 904 comprises LED assembly 912. The LED assemblies 910 and 912 have surface textured encapsulations as described herein to provide for increase light output with excellent heat dissipation and low processing costs.

The lamp 906 comprises a package 914 and LED assembly 916. The LED assembly 916 has a surface-textured encapsulation configured for light extraction as described herein. The lamp 906 may be used for any type of general illumination. For example, the lamp 906 may be used in an automobile headlamp, street light, overhead light, or in any other general illumination application. The illumination device 908 comprises a power source 918 that is electrically coupled to a lamp 920. In an aspect, the power source 918 may be batteries or any other suitable type of power source, such as a solar cell. The lamp 920 comprises a LED assembly 922 which has a surface-textured encapsulation configured for light extraction as described herein.

It should be noted that surface textured encapsulations as described herein are suitable for use with virtually any type of LED, which in turn may be used in any type of illumination device and are not limited only to the devices shown in FIG. 9. Thus, the surfaced-textured encapsulations described herein provide for increased extraction of light emitted from LEDs and can be used in a variety of device applications.

The description of the disclosed aspects is provided to enable any person skilled in the art to make or use the present invention. Various modifications to these aspects may be readily apparent to those skilled in the art, and the generic principles defined herein may be applied to other aspects, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of surface-textured encapsulations have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A light emitting diode (LED) array apparatus comprising:
   a plurality of LEDs mounted to a substrate; and
   an encapsulation comprising a plurality of regions, the encapsulation covering the plurality of LEDs and each region of the encapsulation having a different surface texture texturing configured to extract light, wherein the each surface texture texturing comprises a plurality of light extracting features;
   wherein the light extracting features have varying dimensions.

2. The apparatus of claim 1, wherein each of the light extracting features has a diameter that is greater than 1 millimeter.

3. The apparatus of claim 1, wherein each of the light extracting features has a diameter less than 50 millimeters.

4. The apparatus of claim 1, wherein the plurality of light extracting features comprises first and second light extracting features having respective diameters larger than two or more of the LEDs.

5. The apparatus of claim 4, wherein the respective diameters of the first and second light extracting features are either the same or different.

6. The apparatus of claim 4, wherein each of the first and second light extracting features are selected from a set of features comprising hemispheres, cones, pyramids, and random shapes.

7. The apparatus of claim 1, wherein said encapsulation comprises at least one material selected from silicone and phosphor.

8. The apparatus of claim 1, wherein said encapsulating is formed using a process selected from a set of processes comprising stamping, molding, pattern transferring, and thin film deposition.

9. The apparatus of claim 1, wherein the plurality of light extracting features is selected from a set comprising hemispheres, cones, pyramids, and random shapes.

10. The apparatus of claim 1, wherein said encapsulation has an overall shape that is substantially flat.

11. The apparatus of claim 1, wherein said encapsulation has an overall shape that is domed wherein a center portion is higher than side portions.

12. A method for forming a light emitting diode (LED) array apparatus comprising:
mounting a plurality of LEDs to a substrate; and
encapsulating the plurality of LEDs with an encapsulation comprising a plurality of regions, each region of the encapsulation having a different surface texture texturing configured to extract light, wherein each the surface texture texturing comprises a plurality of light extracting features;
wherein the light extracting features have varying dimensions.

13. The method of claim 12, wherein said encapsulating comprises forming the surface texture using at least one process selected from a set of processes comprising stamping, molding, pattern transferring, and thin film deposition.

14. The method of claim 12, further comprising selecting the plurality of light extracting features from a set of features comprising hemispheres, cones, pyramids, and random shapes.

15. The method of claim 12 further comprising configuring the plurality of light extracting features to comprises first and second light extracting features having respective diameters larger than two or more of the LEDs.

16. The method of claim 15, further comprising setting the respective diameters of the first and second light extracting features to be either the same or different.

17. The method of claim 12, wherein said encapsulating comprises encapsulating at least one of the plurality of light extracting feature so that the diameter is greater than 1 millimeter.

18. The method of claim 12, wherein said encapsulating comprises encapsulating at least one of the plurality of light extracting feature so that the diameter is less than 50 millimeters.

19. The method of claim 12, wherein said encapsulating encapsulation comprises encapsulating the plurality of LEDs with at least one material selected from silicone and phosphor.

20. A lamp having a light emitting diode (LED) array apparatus comprising:
a package;
a plurality of LEDs mounted to a substrate; and
an encapsulation comprising a plurality of regions, the encapsulation covering the plurality of LEDs and with each region of the encapsulation having a different surface texture texturing configured to extract light, wherein the each surface texture texturing comprises a plurality of light extracting features;
wherein the light extracting features have varying dimensions.

* * * * *